United States Patent
Tsironis

(10) Patent No.: US 11,863,163 B1
(45) Date of Patent: Jan. 2, 2024

(54) DIGITAL HYBRID LOAD PULL SYSTEM

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 554 days.

(21) Appl. No.: 16/838,786

(22) Filed: Apr. 2, 2020

(51) Int. Cl.
*H03J 3/28* (2006.01)
*H01P 1/38* (2006.01)
*H03H 11/28* (2006.01)

(52) U.S. Cl.
CPC ............ *H03J 3/28* (2013.01); *H01P 1/38* (2013.01); *H03H 11/28* (2013.01)

(58) Field of Classification Search
CPC ............ H03J 3/28; H01P 1/38; H03H 11/28
See application file for complete search history.

(56) References Cited

U.S. PATENT DOCUMENTS

| | | |
|---|---|---|
| 5,276,411 A | 1/1994 | Woodin, Jr. et al. |
| 7,135,941 B1 | 11/2006 | Tsironis |
| 7,282,926 B1 | 10/2007 | Verspecht et al. |
| 8,497,689 B1 | 7/2013 | Tsironis |
| 9,625,556 B1 | 4/2017 | Tsironis |
| 10,177,429 B1 * | 1/2019 | Tsironis ............... H03J 1/00 |
| 10,348,273 B1 * | 7/2019 | Tsironis ............... H03H 7/40 |

OTHER PUBLICATIONS

Load Pull, [online] Wikipedia, [Retrieved on Nov. 18, 2016]. Retrieved from Internet <URL: https://en.wikipedia.org/wiki/Load_pull>.
"Computer Controlled Microwave Tuner, CCMT", Product Note 41, Focus Microwaves Inc. 1998, pp. 2-4.
"Multi-port Measurements", presentation by D. Blackham and K. Wong, Agilent Technologies, pp. 4 and 9.

* cited by examiner

*Primary Examiner* — Metasebia T Retebo

(57) ABSTRACT

A digital high-speed hybrid load pull test system comprises a slide screw automatic passive tuner, a digital active forward injection loop in a closed loop transmission configuration, calibration and tuning algorithms. The forward active injection loop comprises at least one adjustable coupler, a digital electronic tuner and feedback power amplifier; the passive tuner comprises one or more metallic tuning probes, used to create passive reflection factors. Small signal calibration of the passive and active tuners create a global calibration data base, used to pre-tune in the area of the target impedance and final high power (nonlinear) tuning employs a in-situ signal power wave search and measurement for digital impedances around the small signal pattern. The system provides for high speed low injected power tuning with maximum reflection factor at DUT reference plane reaching unity.

4 Claims, 16 Drawing Sheets

FIG. 1: Prior art

FIG. 3: Partly prior art

DIGITAL HYBRID LOAD PULL SYSTEM

PRIORITY CLAIM

Not applicable

CROSS-REFERENCE TO RELATED ARTICLES

1. Load Pull, [online] Wikipedia, [Retrieved on 2016 Nov. 18]. Retrieved from Internet <URL: https://en.wikipedia.org/wiki/Load_pull>
2. "Computer Controlled Microwave Tuner, CCMT", Product Note 41, Focus Microwaves Inc. 1998, pages 2-4.
3. Verspecht, J. et al., U.S. Pat. No. 7,282,926, "Method and an apparatus for characterizing a high-frequency device-under-test in a large signal impedance tuning environment".
4. Woodin Jr. et al., U.S. Pat. No. 5,276,411, "High power solid state programmable load".
5. Tsironis C., U.S. Pat. No. 7,135,941, "Triple probe automatic slide screw load pull tuner and method".
6. "Multi Port Measurements", presentation by D. Blackham and K. Wong, Agilent Technologies, pages 4 and 9.
7. Tsironis C., U.S. Pat. No. 9,625,556, "Method for calibration and tuning with impedance tuners", Column 9 ff.
8. Tsironis C., U.S. Pat. No. 8,497,689, "Method for reducing power requirements in active load pull system".

BACKGROUND OF THE INVENTION AND PRIOR ART

This invention relates to Non-50Ω load pull testing of microwave transistors (DUT) (see ref 1). Load pull is the method by which the load impedance presented to the DUT at a given frequency is changed systematically and the DUT performance is registered, with the objective to find an optimum impedance matching condition depending on the overall design objectives. This may be maximum power, efficiency, linearity or else.

A traditional "scalar" load pull test system is shown in FIG. 1. It comprises a signal source, source and load impedance tuners, a device under test (DUT, transistor) in a test fixture (that can also be a micro-chip on a semiconductor wafer connected to microscopic wafer probes), and input and output measurement instruments. The instruments can measure power, DC bias and various spectral components, generated either by the source (modulation) or by the non-linearities of the DUT (harmonics). The tuners and the instruments are controlled by a PC controller using appropriate digital communication protocols (GPIB, RS 232, LAN etc.). The data acquired by the test software comprise RF and DC response of the DUT to input stimulus for given source and load impedances. This data is saved in load pull files and serve to (a) qualifying the DUT and (b) designing optimum matching networks for given target performance, this being output power, linearity, efficiency etc. A "vector" load pull system is shown in FIG. 2. A system like this must be used when active tuners are employed (see ref. 6), because it allows measuring, through the bidirectional couplers (20), in real time the actual load impedance <a2>/<b2> even when the active tuner becomes non-linear and any previous calibration is not any more valid.

Embedding the DUT in fixtures, in order to give access to the tuners, introduces signal transformation and insertion loss. This reduces the effective tuning range of the tuners, to the point that the DUT cannot always be physically "matched", i.e. it cannot be presented the optimum load for the target performance. This is the case for most tuners (FIG. 1) used nowadays, which are electro-mechanical slide screw tuners (see ref. 2). Alternatively, in order to compensate for the insertion loss, "active" tuners have been introduced. Those active tuners lag bandwidth, power handling and universality. To increase power handling, to be able to "match" high power devices, active tuners require very high power, expensive, amplifiers (see ref. 8). An advantage of active tuners is their high speed, because they are numerically (digitally) controlled, whereas electro-mechanical tuners have mechanical moving parts and are therefore, in comparison, 100 to 1000 times slower (tuning speed of mechanical tuners is in the range of seconds versus milliseconds of active tuners). High-speed digital electronic tuners (see ref 4) are based exclusively on digital electronic (PIN diode based) technology have limited linearity and tuning range, compared to electro-mechanical slide screw tuners.

A load pull system is more than a tuner. Without control software and associated effective calibration and tuning algorithms, a tuner is only a critical but insufficient component of the load pull system. This invention discloses a hybrid load pull system using high-speed active digital and passive electro-mechanical tuning with the necessary calibration and non-linear impedance synthesis (tuning) algorithms. The system offers advantages of (a) high tuning speed of digital electronic tuners operating at low power (i.e. in linear regime), (b) high tuning range of active tuners and (c) active power savings due to fixed (not moving) pre-matching slide screw electro-mechanical tuner. Or, the system cures the weaknesses of the existing methods.

BRIEF SUMMARY OF THE INVENTION

Per definition, a measurement system includes instruments and methods. In this particular case the instrument is a tuner and the method are its calibration and operation. Tuners are used to create user defined impedances; therefore, an impedance synthesis method is part of a load pull system. The digital high-speed hybrid load pull system comprises (i) a tuner, (ii) a tuner calibration algorithm and (iii) impedance synthesis (tuning) algorithms under real (high power, nonlinear) operation condition. The tuner (i) includes (i.a) a closed loop digital electronic active tuner section and (i.b) a mechanical (passive) pre-matching tuner section. The calibration (ii) algorithm comprises (ii.a) a passive tuner calibration algorithm and (ii.b) an active tuner calibration algorithm. Either calibration algorithms comprise a direct measurement and a de-embedding routine. The impedance synthesis (tuning) (iii) algorithm comprises (iii.a) a combined passive/active pre-tuning algorithm and (iii.b) a nonlinear, iterative, in-situ active search and tune algorithm. In total the digital hybrid load pull system handles (a) high power load pull with (b) reflection factors reaching unity (c) at high speed and (d) with minimized (due to passive pre-matching) active power injection requirement.

The closed loop active tuning mechanism is outlined in FIG. 6: A portion of the incoming signal injected into the test port of the tuner by the DUT is sampled (C1F) using the adjustable coupler and injected back (C2F) towards the DUT after being amplitude- and phase-modulated by the digital electronic tuner (DET) and amplified (G) by the power amplifier of the active loop. The passive tuning mechanism is shown in FIG. 5: the remaining signal from the DUT, after the signal extraction by the first coupler (71, CF1), is reflected by the reflective tuning probe of the passive tuner and is also sent back to the DUT with modified amplitude and phase. Calibration of the overall tuner uses small signal (small signal is defined as the typical signal level used in operating standard vector network analyzers (VNA) and does, usually, not exceed 100 mW) and includes two steps, a) calibration of the passive tuner section using prior art techniques (see ref. 2 and 5) and b) small signal calibration of the closed loop active tuner by measuring s-parameters for a multitude of coupler settings and digital tuner configurations. Calibration data from steps a) and b) are saved. Impedance synthesis also follows two steps. Because in real operation, due to high power generated by the DUT, the active loop may become nonlinear, the small signal calibration may become invalid. Therefore, the small signal calibration is used to pre-tune close to the target impedance and then a fast in-situ real-time search is executed using the digital tuner to obtain a best match (FIG. 13).

DETAILED DESCRIPTION OF THE DRAWINGS

The invention and its mode of operation will be more clearly understood from the following detailed description when read with the appended drawings in which.

DETAILED DESCRIPTION OF THE INVENTION

Figure 3:
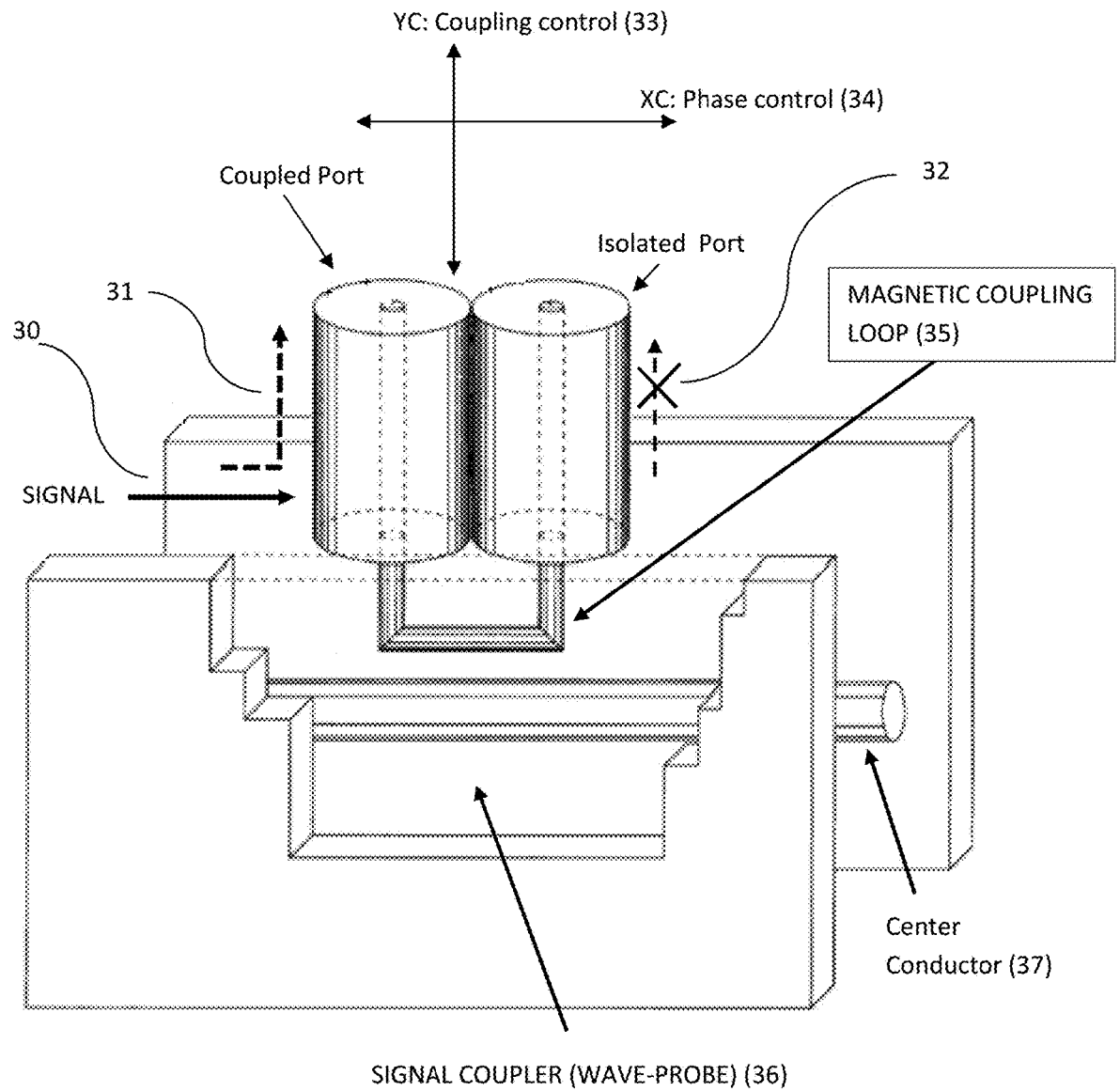
FIG. 3 depicts partly prior art, the perspective 3D view of a cut through an adjustable "wave-probe" type signal coupler.
Figure 7:
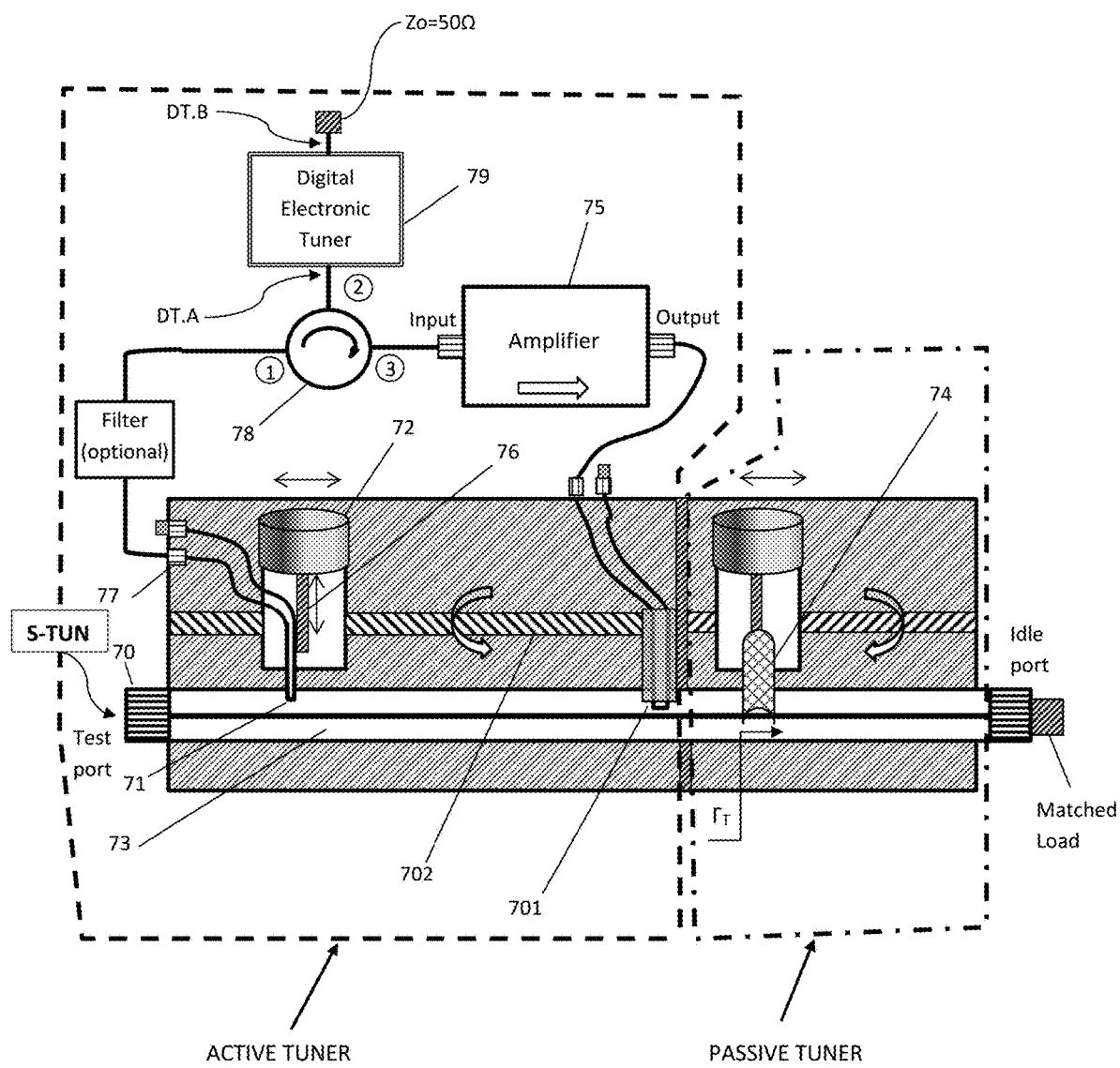
FIG. 7 depicts the complete digital hybrid load pull tuner (DHLPT).

The digital hybrid (active+passive) load pull tuner (DHLPT) comprises two tuning sections, a passive section and an active section, and a common slabline (FIG. 7); the particularity of the apparatus is that the proper choice of the components allows for both sections to share the same slabline (73). The slabline (73) is used to extract signal power "from" the DUT, travelling on the center conductor (37) using coupler (36, 71), amplitude- and phase-modulate (modify), amplify and re-inject the modified signal power "to" the DUT, using coupler (701), towards the test port (70); it does so twofold: a) by retrieving a small portion of the DUT-produced signal power into the active section, suppressing the spurious portion (32) into the isolated port and re-injecting the amplified signal into the DUT via the signal couplers (71) and (701), and b) by reflecting back signal power through the passive tuner probe (74). The couplers and the passive tuner can be integrated in the slabline and, at least one coupler, preferably the coupler (71) closest to the test port, should be adjustable; the extension of the same slabline (73) is also used for simultaneous passive tuning (physical signal reflection back into the DUT) using metallic reflective probe(s) (74) as follows: The signal exiting from the DUT enters the tuner into the test port (70); then it is sampled by signal coupler (71), of which the coupling factor (31) $C1=Real(C1)+j*Imag(C1)=|C1|*exp(j\Phi 1)$ between the input port (30) and the coupled port is amplitude- and phase-adjustable (33, 34); amplitude is controlled by adjusting the penetration of the coupling loop (35) (FIG. 3) into the slabline (73) via the vertical axis (76), which is controlled by the motor (72); the phase is controlled by moving the carriage, which holds the coupling loop (35, 71) along the slabline using ACME (702); the sampled signal power is injected through the coupled port (77) and an optional low pass filter into port 1 of the circulator (78). The signal travels with negligible loss to port 2 of the circulator and is reflected back by the digital electronic tuner (79), at its test port DT.A of which said tuner the second (idle) port DT.B is terminated with matched load (Zo=50Ω). The reflected signal at port 2 of the circulator, having modified amplitude and phase, continues with negligible loss to port 3 and from there to the amplifier (75). The amplified signal is injected through signal coupler (701) back into the slabline (73) towards the test port (70) and the DUT. The remaining (non-sampled) portion of the signal from the test port (70) travels through the slabline to the passive tuner, is reflected back by the tuning probe (74) towards the test port and vector-overlaps with the active injection signal. Depending on amplitude and relative phase of those returning signal waves a controllable reflection factor (S-TUN) is generated at the test port (70), which, due to the amplification of the active part of the signal, can reach |S-TUN|=1 at any reference plane, even beyond the test port, despite intervening insertion loss of the test fixture or wafer probe providing access to the DUT.

Figure 9:
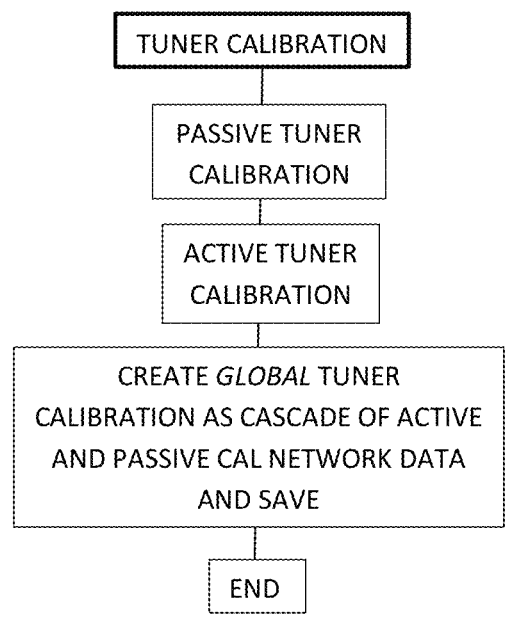
FIG. 9 depicts the general concept of the algorithm of DHLPT calibration.

An impedance tuner (load pull tuner), whether passive or active, should be calibrated before being used. Otherwise impedance synthesis (tuning) degenerates into lengthy in-situ real-time trial and error search operations without a specific direction. Calibration allows accelerating the testing because it uses saved data and computer speed in identifying the searched impedance, before either the lengthy (second- or minute-long) mechanical or even the faster electronic tuning occurs. Memory operations (lasting micro- or nano-seconds) are still orders of magnitude faster. Calibration means measuring the four tuner scattering parameters between arbitrary ports 1 and 2 (s-parameters, S11, S12, S21 and S22, all items are complex numbers Sik=Sik.real+j*Sik.imag) for a number of tuner settings and save them in calibration data files (FIG. 9); calibration data are recalled at measurement time and associated with the measured DUT data, allowing the search for an optimum and/or the creation of "data versus impedance maps", in laboratory jargon called "load-pull contours" (see ref. 1).

Figure 8:
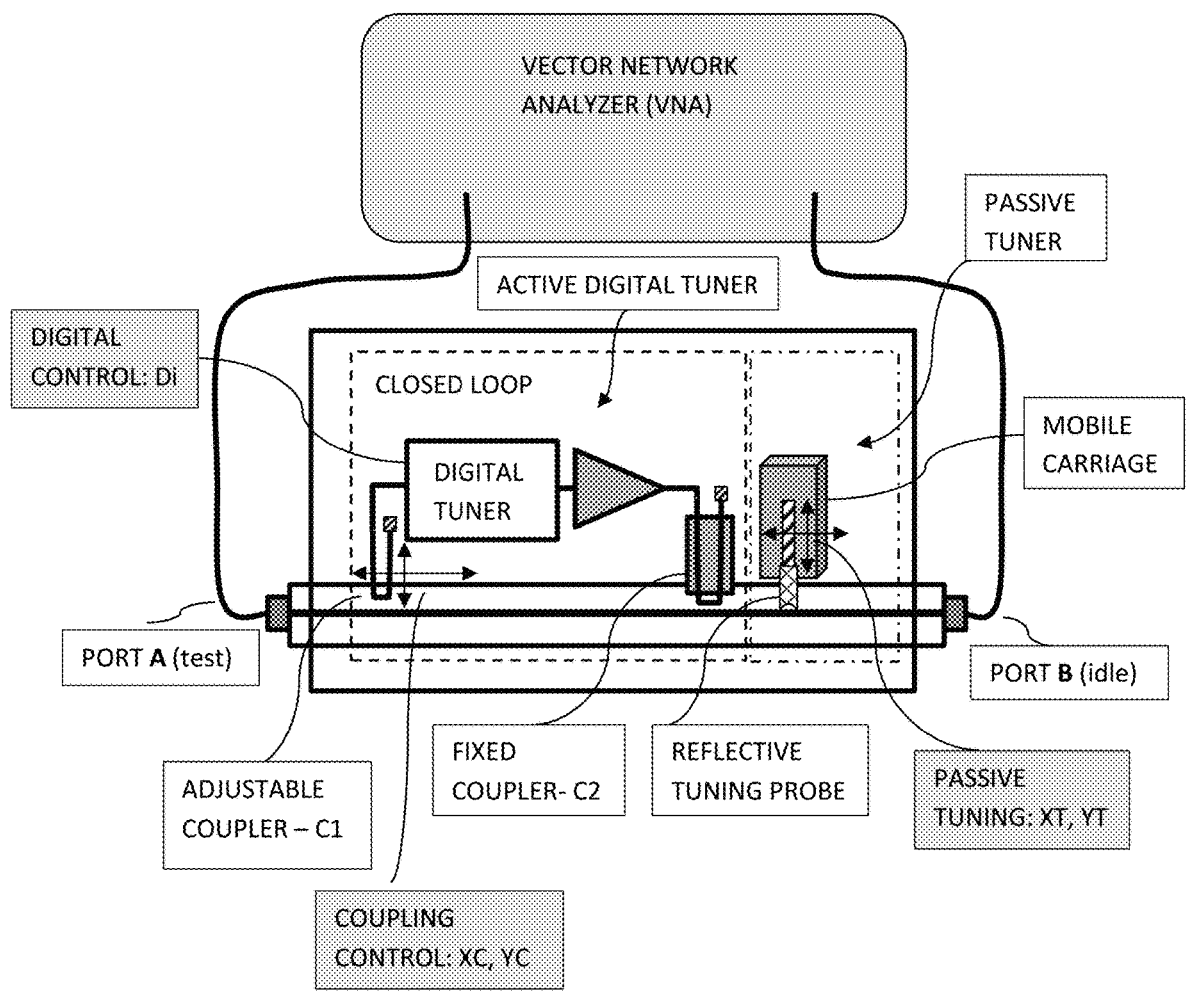
FIG. 8 depicts calibration setup for the DHLPT and a pre-calibrated vector network analyzer (VNA).
Figure 10:
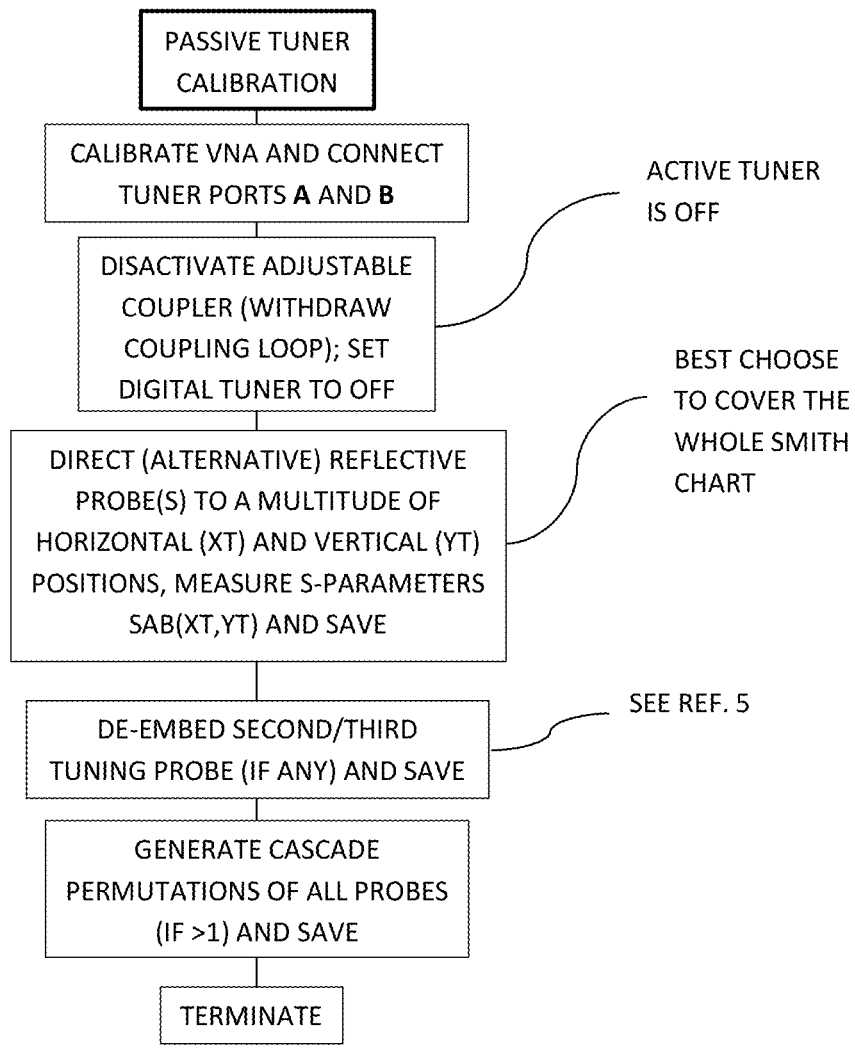
FIG. 10 depicts partly prior art, the detailed algorithm of passive tuner section calibration after disactivating the active tuner section (withdrawing coupling loop of adjustable coupler and setting digital tuner to thru-line).
Figure 14:
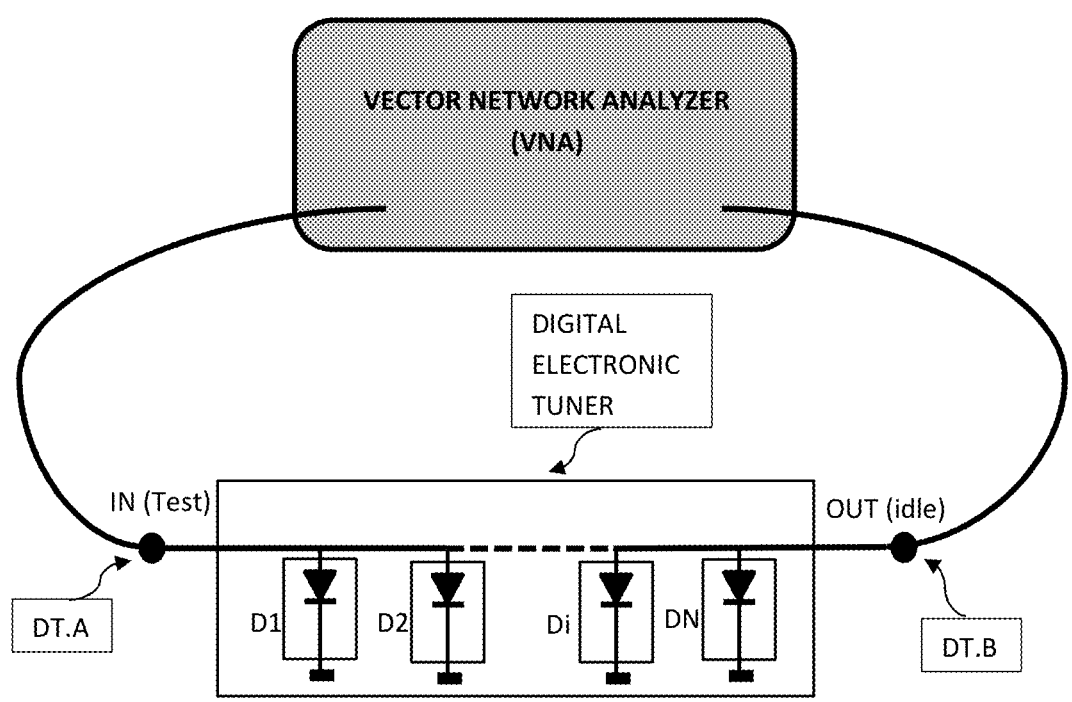
FIG. 14 depicts prior art, conceptual structure of PIN-diode based digital electronic tuner and calibration setup.

As long as the tuner is a passive mechanical slide screw tuner, it can be assumed that its RF behavior will not change with the power injected (within reasonable limits) into it by the DUT; in this case the tuner is linear and calibration is straight forward s-parameter measurement and saving (FIG. 10, ref. 7). For this s-parameters between ports A and B (FIG. 8) are measured for a multitude of passive tuning probe (74) horizontal and vertical positions XT and YT, with the active tuner turned OFF (coupling loop 71, 35 withdrawn and, if necessary, digital tuner 79, set to THRU, or all diodes turned OFF to open circuit, FIG. 14), and saved in a passive tuner calibration data file. In the case where the passive tuner comprises more than one tuning probe (used for high reflection or harmonic tuning), s-parameters are measured individually for each probe, all other probes being withdrawn from the slabline and s-parameters of all except the first, closest to the test port, probe are de-embedded (cascaded with the invers matrix of the initialized (all probes withdrawn) tuner s-parameter matrix $[SAB0]^{-1}$). In this case the overall passive tuner calibration matrix is created in computer memory as the cascade of all permutations of s-parameters of all tuning probes for all (harmonic or not) test frequencies and saved.

Active systems include amplifiers and amplifiers are often used to their limit and become notoriously nonlinear, because they are used at the maximum of their capability, mainly for cost or feasibility reasons; i.e. if there is need for 10 W power, rarely somebody will either buy a 100 W amplifier at a multiple of the cost, just to be on the safe side regarding linearity, or such high power amplifiers do not even exist for a specific frequency. An additional handicap is the fact that the amplifier may, without warning, become nonlinear during the same operation, as the power generated by the DUT changes.

Figure 4:
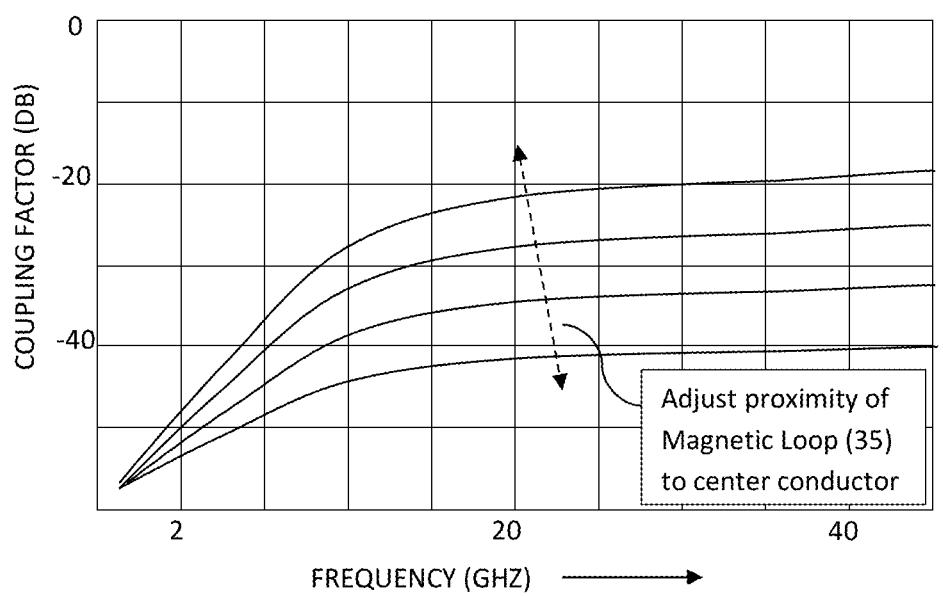
FIG. 4 depicts response of coupling factor as a function of controlling the magnetic loop penetration in the slabline.

Since, normally, s-parameters are defined and measured in the linear range (also called "small signal"), it follows that, such data will become invalid at the moment the DUT produces enough power to cause the amplifier to shift into the nonlinear range, in which case its gain G and transmission phase (F will change; since in the active system the gain and phase of the amplifier are part of and determine the validity of the calibration, we are facing an impasse. The same is valid, in the present case, also with the digital electronic tuner, which uses PIN diodes as control devices (see ref. 4); these diodes may also become nonlinear at certain power, even though the relative low coupling factor of the adjustable coupler (71) will reduce the DUT power by (typically) 20-30 dB (FIG. 4). It is assumed therefore, that, for these reasons, calibrations of active systems cannot be used entirely independently to operate under arbitrary input power conditions. In this invention we, therefore, use (i) a small signal pre-calibration of the active tuning section and proceed (ii) to the final tuning using in-situ real-time measurement, in two steps.

The active tuning section calibration comprises two steps (FIG. 11): in a first step one has to characterize separately the digital tuner. This happens by connecting the input (DT.A) and output (DT.B) ports of the digital tuner to a pre-calibrated VNA (FIGS. 7 and 14) and measure s-parameters. We use a de-embedding technique by which each element (diode) at a time is switched ON (=short), all other diodes remaining OFF (=open). This means at a set of N (typically N=12) diodes we measure N sets of s-parameters. Then we cascade each set, except the set associated with the first element D1 (FIG. 14) with the invers matrix of the digital tuner $[SDT0]^{-1}$, measured with all elements turned OFF. Subsequently all $2^N$ permutations of all [SDTi] (i=1 to i=$2^N$) matrices are generated numerically and only the test port reflection factor SDTi.11 is saved; in case N=12 this results to a data-base of $2^{12}$=4096 complex numbers.

Figure 15:
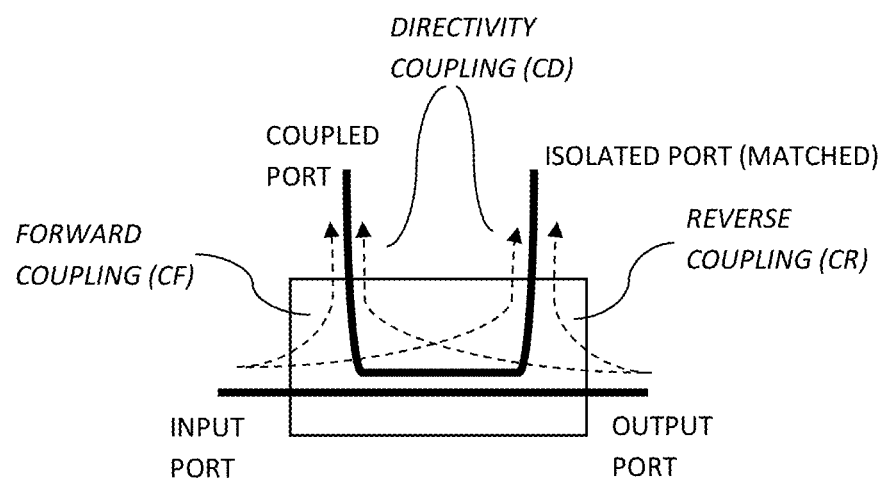
FIG. 15 depicts prior art, definitions of signal transfer in directional couplers.

As a next step the active loop is calibrated as a function of the coupling factor and phase of comprising the adjustable coupler. For this the tuning probe(s) of the passive tuner are withdrawn and an OPEN is connected to port 2 of the circulator to create a maximum transmission between ports 1 and 3. Then s-parameters are measured between ports A and B for a multitude NX (typical NX=10) horizontal (XC) and NY (typical NY=3) vertical (YC) positions of the coupling loop yielding the matrices [SAB(XC, YC)] comprising typically items. Since the OPEN at port 2 corresponds to SDT.11=1 (SDT.11=Test port Reflection factor of Digital Tuner), we multiply [SAB(XC, YC)] with SDTi.11 to get the overall active tuner transmission gain $S_{AT}.21$. and reflection factor $S_{AT}.11$; the very small directivity couplings C2D*C1D (FIG. 15) gain of the amplifier infers that $S_{AT}.22 \approx 0$ (very small signal injected into port B reaches the amplifier to be re-injected reverse into the slabline) and $S_{AT}.12 \approx 1$-C2R-C1R, wherein C1R and C2R are the inverse couplings of the two couplers, from the output to the isolated ports (FIG. 15); those couplings are of the order of −15 dB to −30 dB (0.03 to 0.001) and will extract and withdraw a very small portion of the signal power injected into port B.

Figure 11:
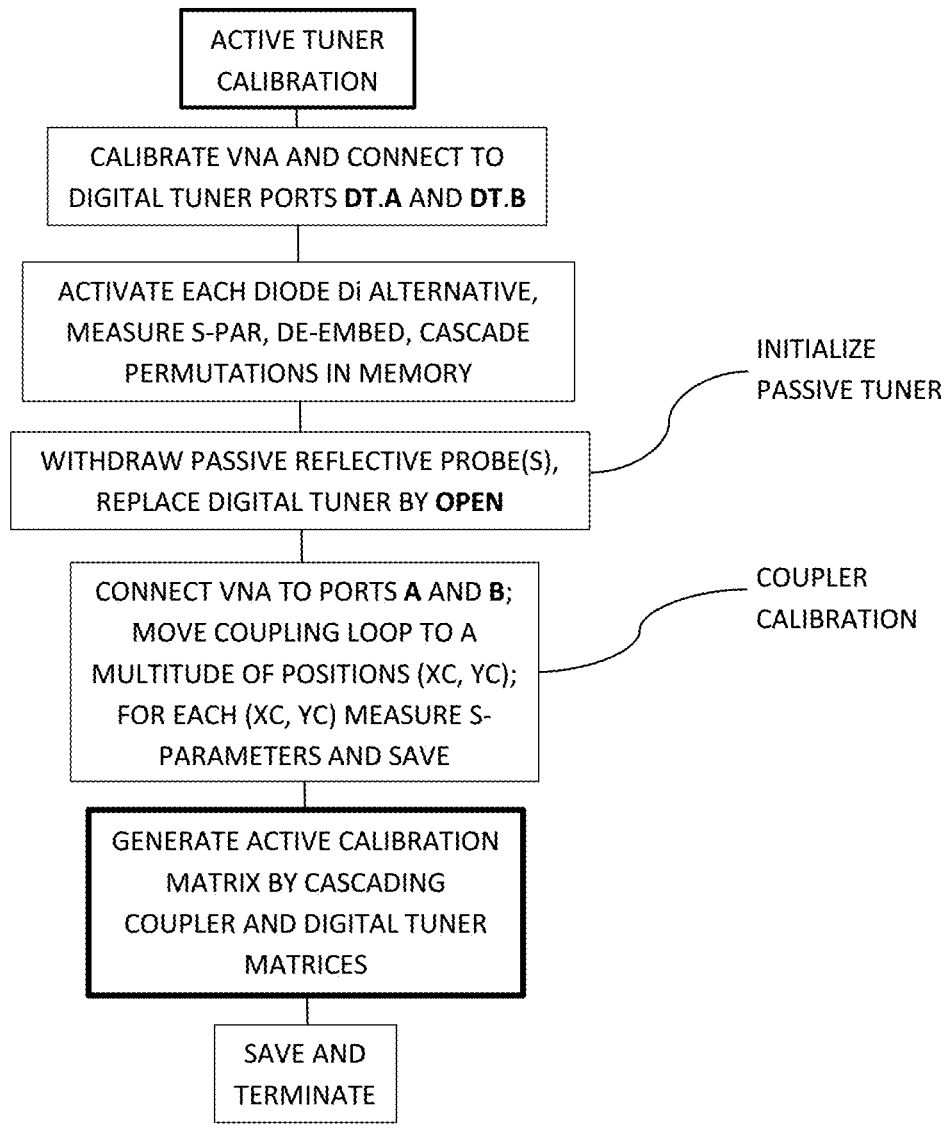
FIG. 11 depicts the detailed algorithm of active tuner section calibration after disactivating the passive tuner section (withdrawing tuning probe(s)).
Figure 12:
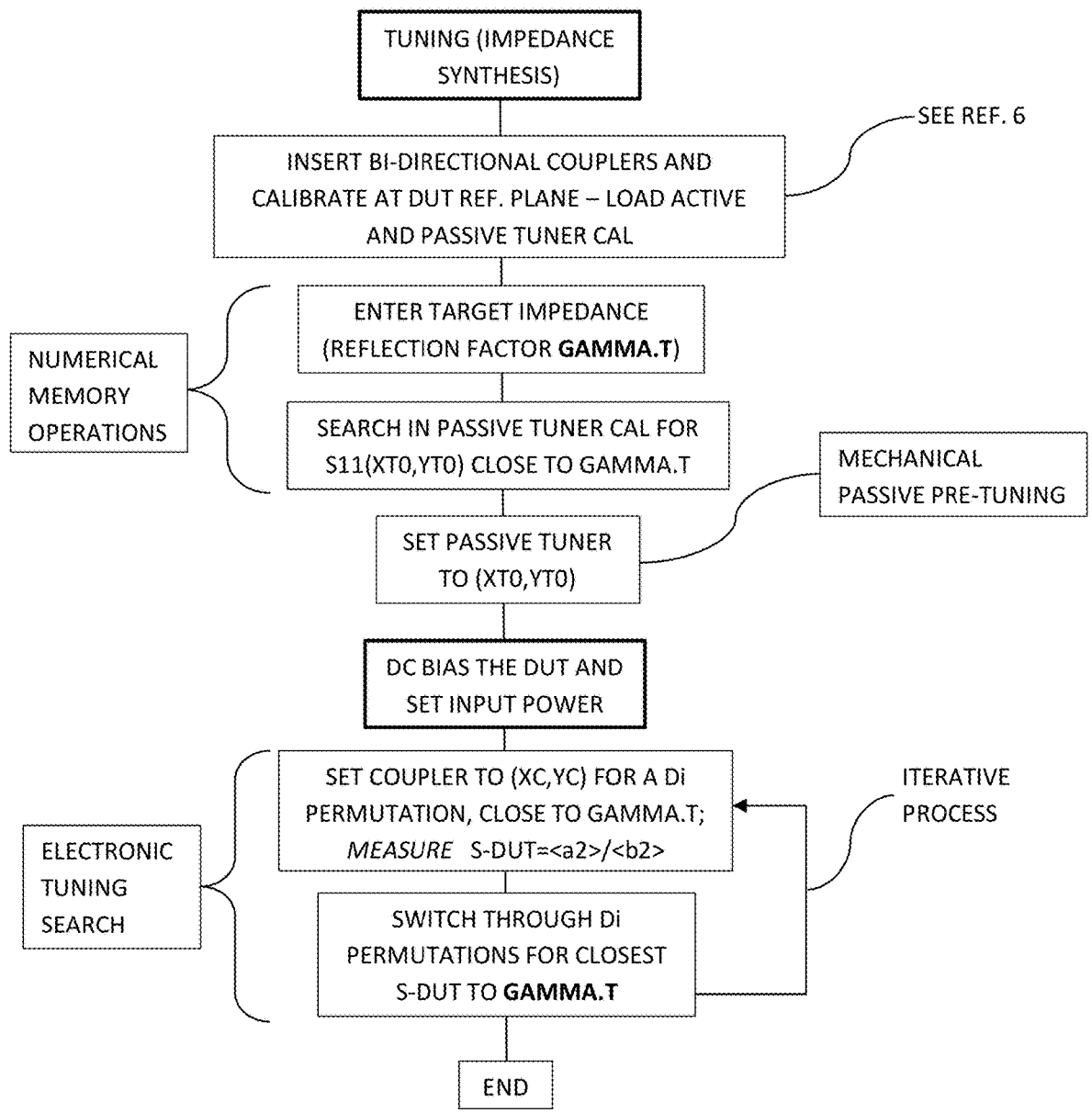
FIG. 12 depicts the detailed algorithm for linear pre-tuning and iterative nonlinear hybrid load pull tuning.

As a result we have two sets of s-parameters of two cascaded tuners, the active tuner from port A to the fixed coupler and the passive tuner from the fixed coupler to port B. Since the s-parameters of the passive tuner have been already de-embedded, we can now cascade the s-parameters of the two tuners to obtain the global, small signal, hybrid tuner calibration. Assuming the passive tuner is a single probe tuner and is calibrated at 400 settings, the digital tuner has 12 diodes and the coupler is calibrated at 30 settings (3 vertical-amplitude and 10 horizontal-phase) number of measurements will be 400+30+12+2=444; (2 are the zero matrix measurements); the generated data will contain 400×30× 4096=49,152,000 data points. If the passive tuner includes three independent probes for $2^{nd}$ and $3^{rd}$ harmonic tuning then the total number of measurements will be 1200+30+ 12+2=1244 and the of the generated data will contain $400^3$×30×4096=7,864*$10^{12}$ data points (FIG. 11). However, handling this amount of data requires a super-computer. Therefore, all operations are split in steps (FIG. 12). For instance, passive pre-tuning requires either the 400 points at the fundamental frequency, or an efficient search strategy in the $400^3$=64,000,000 data points for 3 harmonic tuning (see ref. 7). Once the passive pre-tuning (fundamental or harmonic) is settled, the in-situ real-time search amongst the only 30×4096=122,880 points of the combined tuning states of the "coupler-digital active tuner" assembly around vector (132) in FIG. 13 will rapidly yield an optimum.

Notice: throughout this disclosure we use complex scattering (s-) parameters in single form S=Real(S)+j*Imag(S) and in matrix form [S]=S1, S2, S3, S4), each element being also a complex number. Thus, S includes two real numbers, [S] includes eight real numbers. Data blocks comprising a multitude M of s-parameter matrices [S(M)] are designated with brace parenthesis {[S(M)]}.

Figure 1:
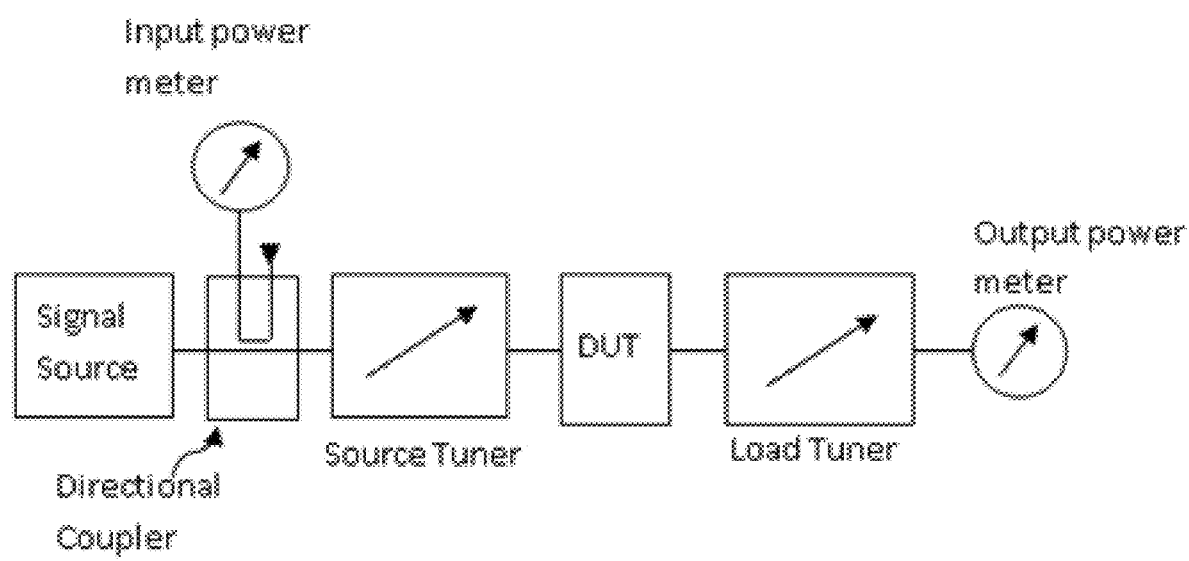
FIG. 1 depicts prior art, a typical scalar load pull test setup.
Figure 2:
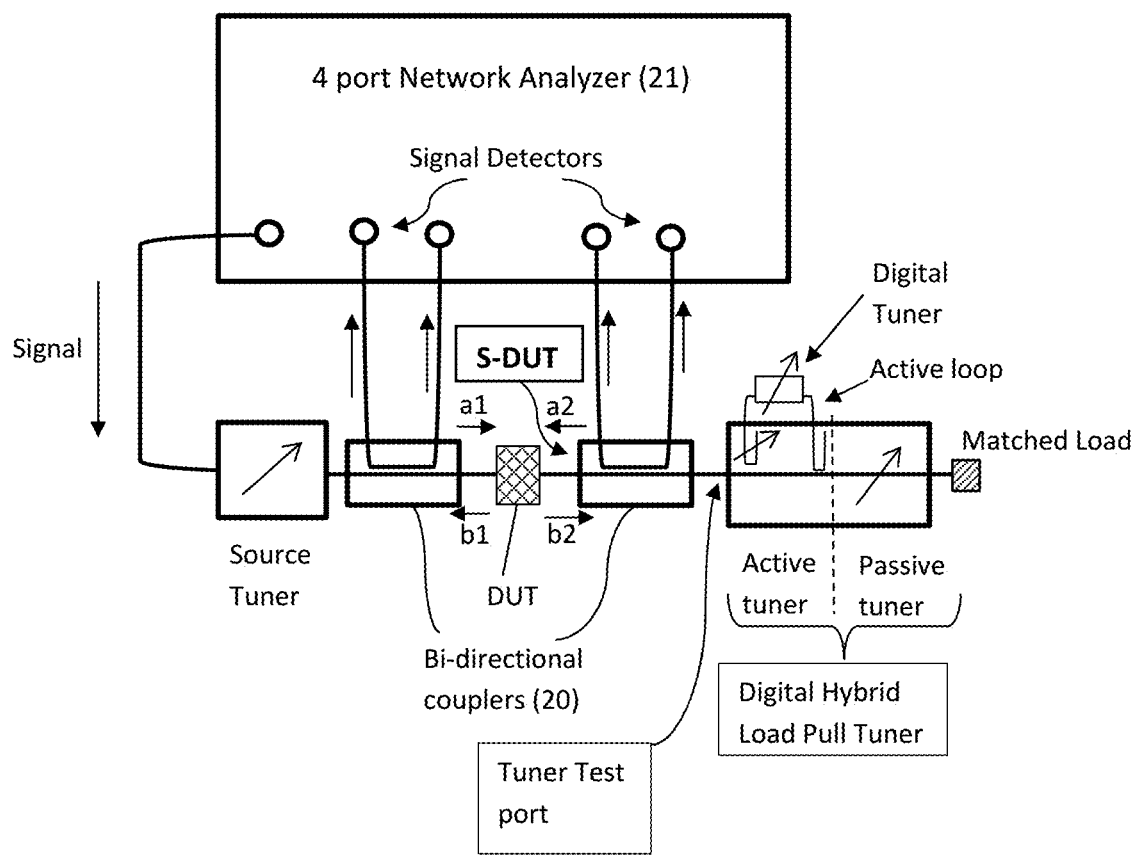
FIG. 2 depicts partly prior art, a typical vector load pull test setup with the new digital hybrid tuner as a load tuner and a prior art slide screw tuner as a source tuner.
Figure 6:
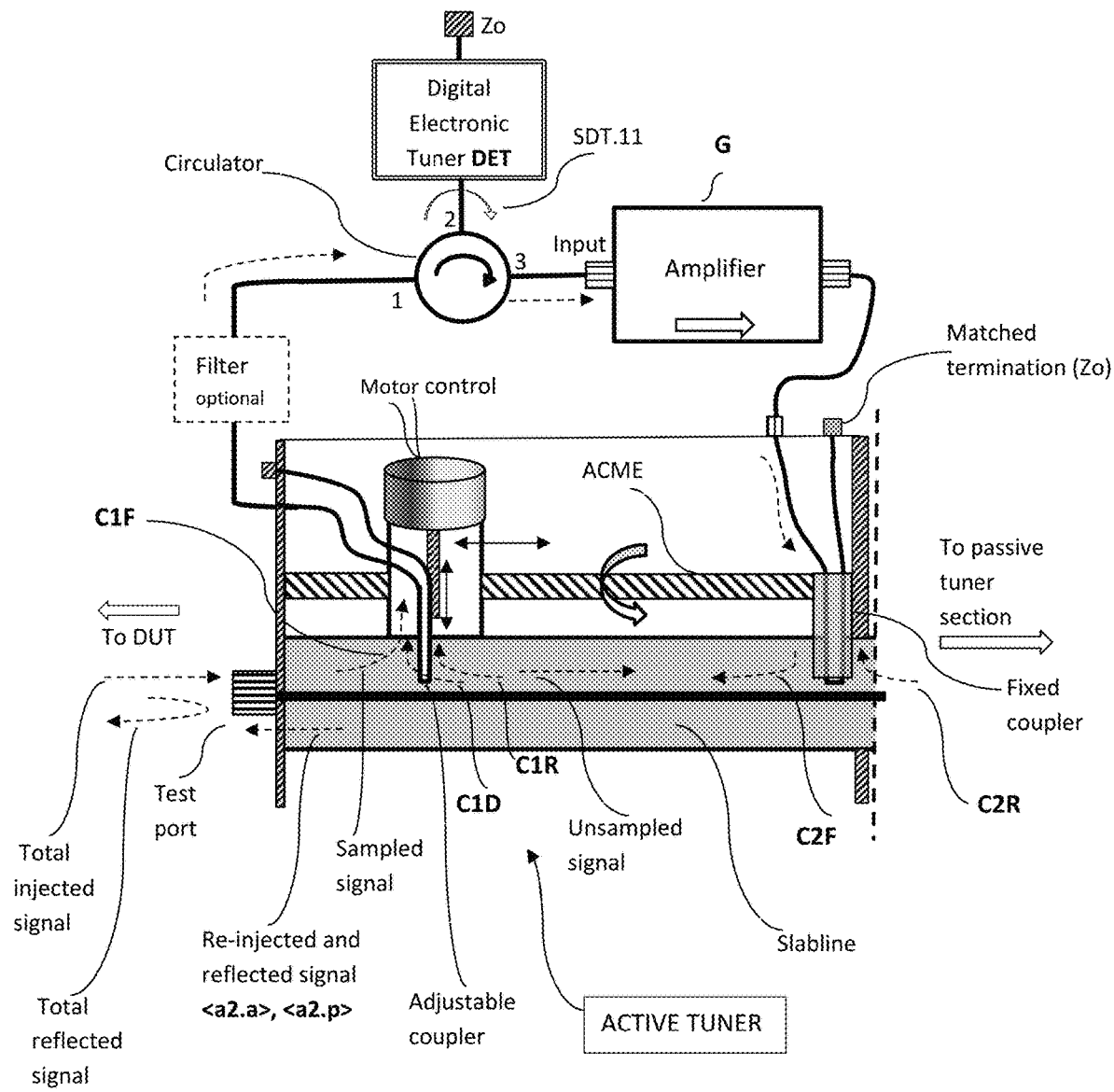
FIG. 6 depicts the active tuning section of the digital hybrid load pull tuner and conceptual signal flow.
Figure 16:
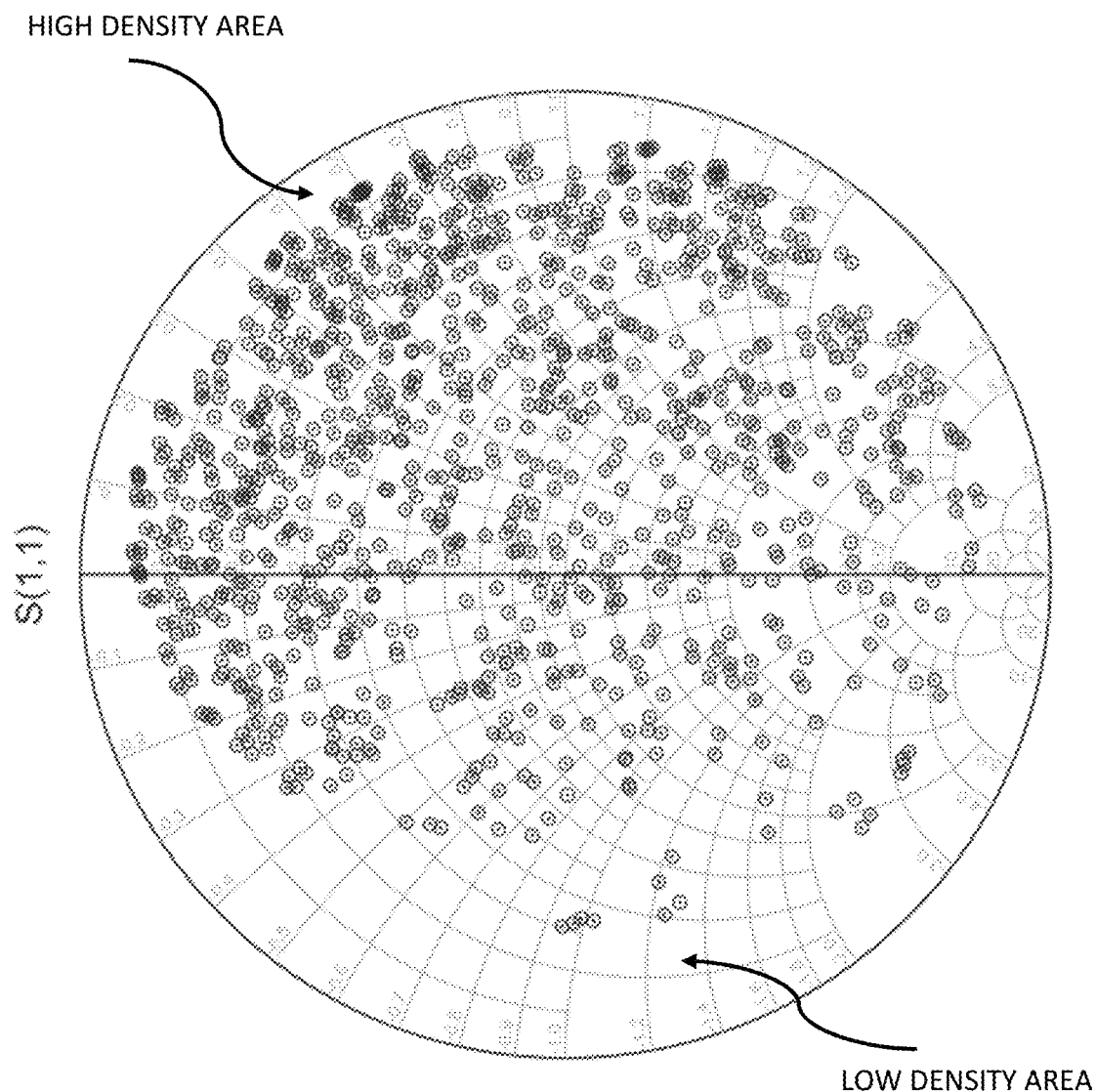
FIG. 16 depicts typical impedance (reflection factor) point distribution of the 12-diode digital tuner.

Impedance synthesis (Tuning) in the digital hybrid load pull tuner system (DHLPS) occurs as follows: In a first step the small signal calibration of the passive tuning section is used to pre-tune (132) close to the overall target impedance (136) area (FIG. 13); for this, first the passive tuner is moved (vector 132 pointing to impedance (reflection factor) (130)); the position and size of the impedance cloud (133) around the point (130) is created by the digital tuning points (131) depending on the amplitude and phase of the vector (132) and the factor "coupling coefficients C1F times C2F times the gain of the amplifier G": C1F*C2F*G)", FIG. 6. The smaller this factor is, the smaller the cloud surface (described by the radius 134) controllable by the digital tuning (131). The density of the digital tuning points is non homogenous over the Smith chart (see FIG. 16). It is expected that proper choice of the amplitude and phase of the C1F*C2F*G factor (which is in-situ adjustable via C1F=|C1F|*exp(jΦ1F)) will allow the initial small signal calibration to create and rotate (135) a, due to increased DUT output power, slightly different large-signal tuning area around the optimum target point. Actual tuned impedances are measured in real time by acquiring signal power waves <a2> and <b2> through at DUT reference plane calibrated (see ref. 6) bi-directional couplers (20), see ref. 3 shown in FIG. 2 and measured using the VNA (21). The power waves <a2> and <b2> at the DUT port, not only allow calculating the actual linear or non-linear load reflection factor S11.DUT=<a2>/<b2>, presented by the hybrid load pull tuner, but also determining the other RF characteristics of the DUT such as the delivered power, gain, efficiency, linearity and spectral behavior.

Figure 5:
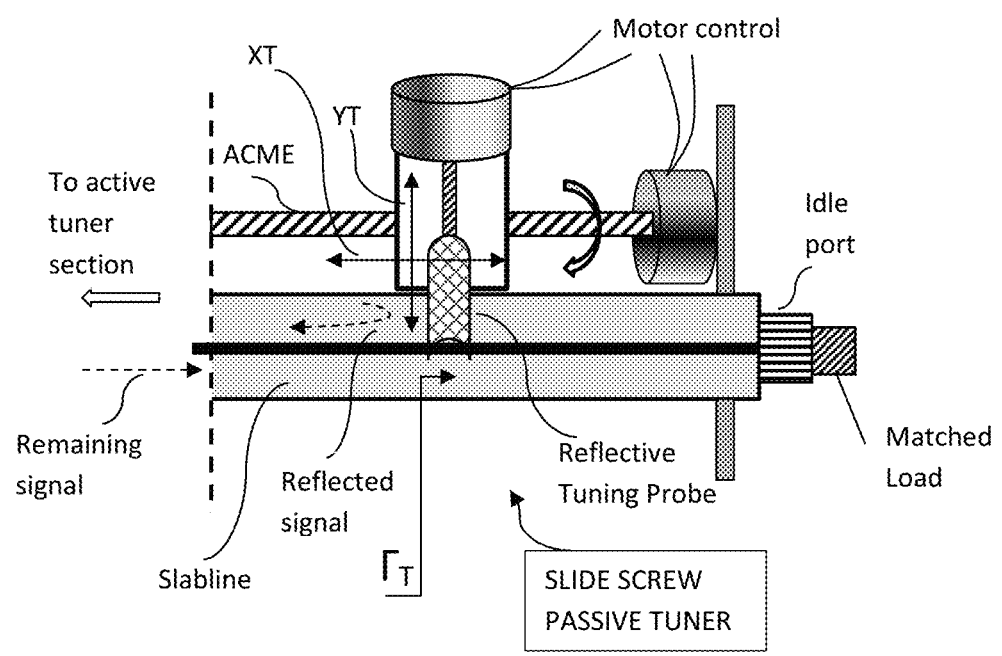
FIG. 5 depicts the passive slide screw tuning section of the digital hybrid load pull tuner.

In short, the two small signal calibrations are applied, in a first approximation, overlapped to create an impedance: S11.DUT=S11.PASSIVE+S11.ACTIVE=(<a2.p>+<a2.a>)/<b2>, FIGS. 5 and 6) both referred to the test port. The passive reflected signal <a2.p> is weakened on its way to the test port through signal extraction by the directivity couplings C2D and C1D, but still this is a secondary effect of the order of 5% and is already part of the passive tuner calibration. In conclusion the small signal calibration can place the total load pull tuning vector close to the target, from where the in-situ measured large signal digital tuning will take over. Considering that neither the passive reflection wave <a2.p>, nor the directivity couplings C1D, C2D change with nonlinear amplifier behavior, this is a valid approach. In fact the small signal calibration of the passive tuner includes the leaks into the forward and returning signal into the signal couplers: the total returned signal <a2.p> can be calculated as follows: <a2.p>=<b2>*(1−C1F)(1−C2F)*$\Gamma_T$*(1−C2R)*(1−C1R) whereby $\Gamma_T$ is the reflection factor of the passive tuner (FIG. 5) and, assuming typical values C1R≈C2R≈0.03, C1F≈C2F≈0.1, leads to <a2.p>/<b2>≈0.76*$\Gamma_T$. The complication arises when active injection is superimposed and amplified signal leaks through C2R towards the passive tuner and is reflected back, will affect the passive tuning vector. This secondary effect shall be taken care of in the in-situ search though.

Figure 13:
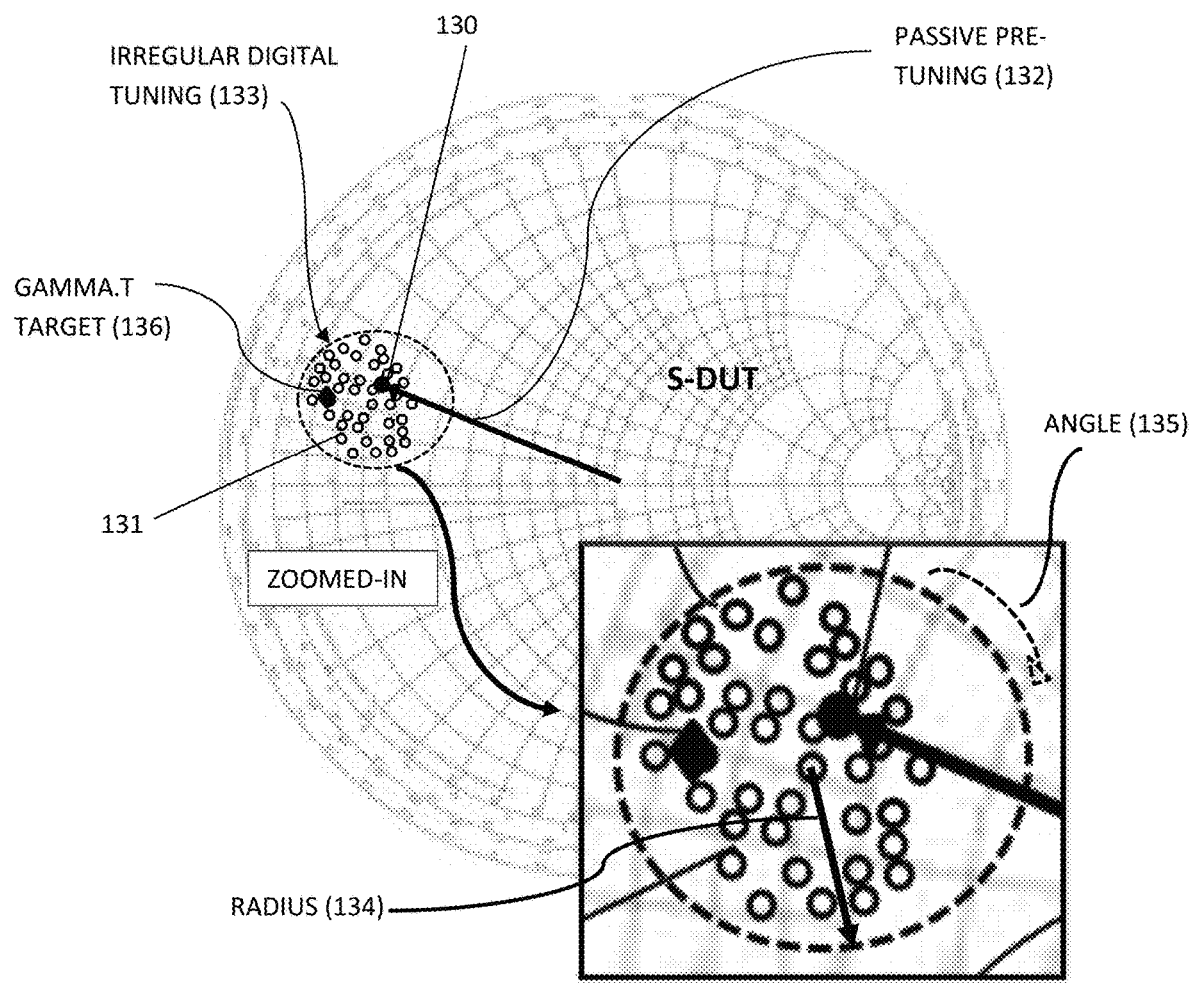
FIG. 13 depicts schematically the creation of passive pre-tuning and iterative digital active load pull tuning vectors.

As shown in FIG. 13, the small signal (linear) calibration, will allow placing the total reflection factor vector (load impedance) tuning space (cloud) in the general area of the target impedance (the conjugate complex of the DUT internal impedance). From now on the calibration data are not used any more, because they may not be valid, due to non-linearity of the amplifier mostly. Instead the actual load reflection factor S11.DUT=<a24<b2> is measured by the VNA (21) using the bidirectional couplers (20) (vector load pull, FIG. 2 and ref 6). This allows for a high-speed random search to be executed using only the digital tuner in the narrow area defined by the passive pre-tuning and coupler settings (FIG. 13).

This application discloses the concept of a digital high-speed hybrid load pull tuner system (DHLPTS) and the concept of calibrating the active and pre-matching passive tuners and in-situ large signal tuning. Obvious alternatives shall not impede on the originality of the concept

What is claimed is:

1. A digital hybrid load pull tuner comprising:
   a digital, closed loop active signal injection tuner, and
   an electro-mechanical (passive) slide screw tuner, both said tuners using a common slotted airline (slabline) having a test port and an idle port and being divided into two sections, a first section towards the test port hosting part of the active injection tuner, and a second section towards the idle port hosting the passive slide screw tuner;
wherein
   the digital, closed loop active signal injection tuner comprises:
      a digital electronic tuner including N switching elements (N>4) and having a test port and an idle port, and
      a circulator having three ports, port #1, port #2 and port #3, and two signal couplers incorporated in the slabline, a first adjustable signal coupler and a second signal coupler, each having an input, an output, a coupled and an isolated port, and a magnetic coupling loop inserted into the slabline, and an amplifier having an input and an output port;
and wherein
   both signal couplers share the slabline,
   the first adjustable signal coupler is mounted on a first mobile carriage towards the test port of the slabline, and the second signal coupler is inserted between the first adjustable signal coupler and the slide screw tuner;
and wherein
   the coupled port of the first signal coupler is connected to the port #1 of the circulator, the port #2 of the circulator is connected to the test port of the digital electronic tuner, the port #3 of the circulator is connected to the input port of the amplifier, and the output port of the amplifier is connected to the coupled port of the second signal coupler.

2. The digital hybrid load pull tuner of claim 1
wherein
   the electro-mechanical slide screw tuner is mounted in the second section of the slabline and comprises:
      at least one, remotely controlled, mobile carriage sliding along the slabline and carrying at least one, remotely controlled, reflective tuning probe, insertable perpendicularly into the slot of the slabline.

3. The digital hybrid load pull tuner of claim 1
wherein
   the first adjustable signal coupler comprises
      a magnetic coupling loop attached to a vertically adjustable axis of the first mobile carriage and insertable into the slot of the slabline.

4. A small signal calibration method for the digital hybrid load pull tuner of claim 1 comprising the following steps:
   a) calibrating the passive slide screw tuner, between the test port and the idle port of the slabline with the active tuner turned OFF,
wherein
   a1) s-parameters between the test port and the idle port of the slabline are measured with the tuning probes withdrawn from the slabline, and saved as matrix [SP0]; s-parameters between the test port and the idle port of the slabline are measured for a multitude of horizontal XT and vertical YT positions of each individual tuning probe, all remaining probes having been withdrawn from the slabline, and saved as matrices [SP(XT, YT)];

a2) s-parameters of all tuning probes, except of the tuning probe closest to the test port, are de-embedded (cascaded with the inverse matrix $[SP0]^{-1}$) and permutations of cascaded s-parameters of all tuning probes are calculated and saved;

b) calibrating the digital, closed loop active injection tuner, with the passive tuning probes withdrawn from the slabline, in two steps:
　b1) calibrating the digital electronic tuner;
　b2) calibrating the digital active injection closed loop;
wherein
　b1) the digital electronic tuner is calibrated between its test the idle ports as follows:
　　b1.1) s-parameters are measured with all N>1 digital switches set to OFF (open) and saved as [SD0] matrix,
　　b1.2) each individual switch Di ($1 \leq i \leq N$) is turned ON (closed), all other switches being set to OFF, and s-parameters are measured and saved in matrices [SDi];
　　b1.3) all s-parameter matrices [SDi], except for [SDI], are cascaded with the invers matrix $[SD0]^{-1}$ and saved;
　　b1.4) all 2 N permutations of all s-parameter matrices in step b1.3) are generated in computer memory and saved as matrices [SDj] for ($1 \leq j \leq 2^N$);
　b2) the digital, active injection closed loop is calibrated as follows:
　　b2.1) the reflection factor S11 is measured at the test port of the slabline, with an OPEN connected to port #2 of the circulator, for a multitude of NX horizontal (XC) positions of the first carriage and NY vertical (YC) positions of the vertical axis of the first carriage and saved as S11 (XC, YC);
　　b2.2) the NX*NY reflection factors S11 (XC, YC) of step b2.1) are multiplied with the reflection factors S11 of the $2^N$ s-parameter permutations of matrices [SDj] of step b1.4) and saved.

\* \* \* \* \*